US008545236B2

(12) United States Patent
Roberts

(10) Patent No.: US 8,545,236 B2
(45) Date of Patent: Oct. 1, 2013

(54) SOCKET FOR SURFACE MOUNT MODULE

(71) Applicant: Digi International Inc., Minnetonka, MN (US)

(72) Inventor: John Clark Roberts, Cedar Hills, UT (US)

(73) Assignee: Digi International Inc., Minnetonka, MN (US)

( * ) Notice: Subject to any disclaimer, the term of this patent is extended or adjusted under 35 U.S.C. 154(b) by 0 days.

(21) Appl. No.: 13/725,426

(22) Filed: Dec. 21, 2012

(65) Prior Publication Data

US 2013/0104395 A1  May 2, 2013

Related U.S. Application Data

(62) Division of application No. 13/074,300, filed on Mar. 29, 2011, now Pat. No. 8,337,217.

(51) Int. Cl.
H01R 12/00 (2006.01)

(52) U.S. Cl.
USPC .......................................................... 439/68

(58) Field of Classification Search
USPC .................. 439/68, 64–67, 69–74; 29/25.01; 324/755, 762
See application file for complete search history.

(56) References Cited

U.S. PATENT DOCUMENTS

| 3,910,664 | A | * | 10/1975 | Pauza et al. | 439/71 |
|---|---|---|---|---|---|
| 4,222,622 | A | * | 9/1980 | Griffin et al. | 439/71 |
| 4,504,887 | A | * | 3/1985 | Bakermans et al. | 361/758 |
| 4,516,816 | A | * | 5/1985 | Winthrop | 439/70 |
| 4,616,895 | A | * | 10/1986 | Yoshizaki et al. | 439/330 |
| 4,918,513 | A | * | 4/1990 | Kurose et al. | 439/73 |
| 4,962,356 | A | * | 10/1990 | Eberlein et al. | 324/754.08 |
| 5,126,657 | A | * | 6/1992 | Nelson | 324/756.02 |
| 5,199,880 | A | * | 4/1993 | Arai | 439/65 |
| 5,288,236 | A | * | 2/1994 | McIntyre | 439/70 |
| 5,328,383 | A | * | 7/1994 | Savant | 439/266 |
| 5,368,497 | A | * | 11/1994 | Nagumo | 439/266 |
| 5,451,165 | A | * | 9/1995 | Cearley-Cabbiness et al. | 439/71 |
| 5,742,171 | A | * | 4/1998 | Matsunaga et al. | 324/756.02 |
| 5,800,193 | A | * | 9/1998 | Tsubakihara et al. | 439/266 |
| 5,847,572 | A | * | 12/1998 | Iwasaki et al. | 324/754.08 |
| 5,896,036 | A | * | 4/1999 | Wood et al. | 324/756.02 |

(Continued)

OTHER PUBLICATIONS

"U.S. Appl. No. 13/074,300, Notice of Allowance mailed Aug. 21, 2012", 5 pgs.

(Continued)

*Primary Examiner* — Alexander Gilman
(74) *Attorney, Agent, or Firm* — Fogg & Powers LLC

(57) ABSTRACT

In an example, a method includes aligning a pin of a surface mount module with a corresponding first pin of a header pin assembly of a socket assembly of a circuit board. The first pin includes a first portion configured to electrically couple to the circuit board. A second portion includes a retention feature configured to selectively retain the second portion in engagement with the pin of the surface mount module. The surface mount module is moved in a first direction toward the circuit board, wherein the pin of the surface mount module pushes against the second portion to move the second portion to a second position to allow the pin of the surface mount module to pass by the retention feature. The second portion is configured to move back toward a first position once the pin is moved past the retention feature to engage the pin.

17 Claims, 7 Drawing Sheets

(56) References Cited

U.S. PATENT DOCUMENTS

| | | | |
|---|---|---|---|
| 5,921,814 A * | 7/1999 | Maruyama | 439/607.35 |
| 6,064,218 A * | 5/2000 | Godfrey et al. | 324/750.25 |
| 6,377,061 B1 * | 4/2002 | Settle et al. | 324/756.02 |
| 6,448,803 B1 * | 9/2002 | Chung | 324/756.02 |
| 6,547,837 B2 * | 4/2003 | Nagamine | 29/25.01 |
| 6,554,653 B2 | 4/2003 | Henneberger | |
| 6,741,088 B2 * | 5/2004 | Vizcara et al. | 324/756.05 |
| 7,214,073 B2 * | 5/2007 | Asai | 439/74 |
| 7,309,238 B2 * | 12/2007 | Yang | 439/71 |
| RE41,250 E * | 4/2010 | Henneberger | 439/676 |
| 7,811,110 B2 * | 10/2010 | He et al. | 439/218 |
| 8,147,278 B2 * | 4/2012 | Renteria et al. | 439/676 |
| 8,292,634 B2 * | 10/2012 | Takahashi | 439/71 |
| 2008/0233803 A1 | 9/2008 | Renteria et al. | |
| 2012/0252235 A1 | 10/2012 | Roberts | |

OTHER PUBLICATIONS

"U.S. Appl. No. 13/074,300, Response filed May 1, 2012 to Restriction Requirement mailed Apr. 6, 2012", 7 pgs.

"U.S. Appl. No. 13/074,300, Response filed Jul. 16, 2012 to Non Final Office Action maield May 11, 2012", 10 pgs.

"U.S. Appl. No. 13/074,300, Restriction Requirement mailed Apr. 6, 2012", 6 pgs.

"U.S. Appl. No. 13/704,300, Non Final Office Action mailed May 11, 2012", 10 pgs.

* cited by examiner

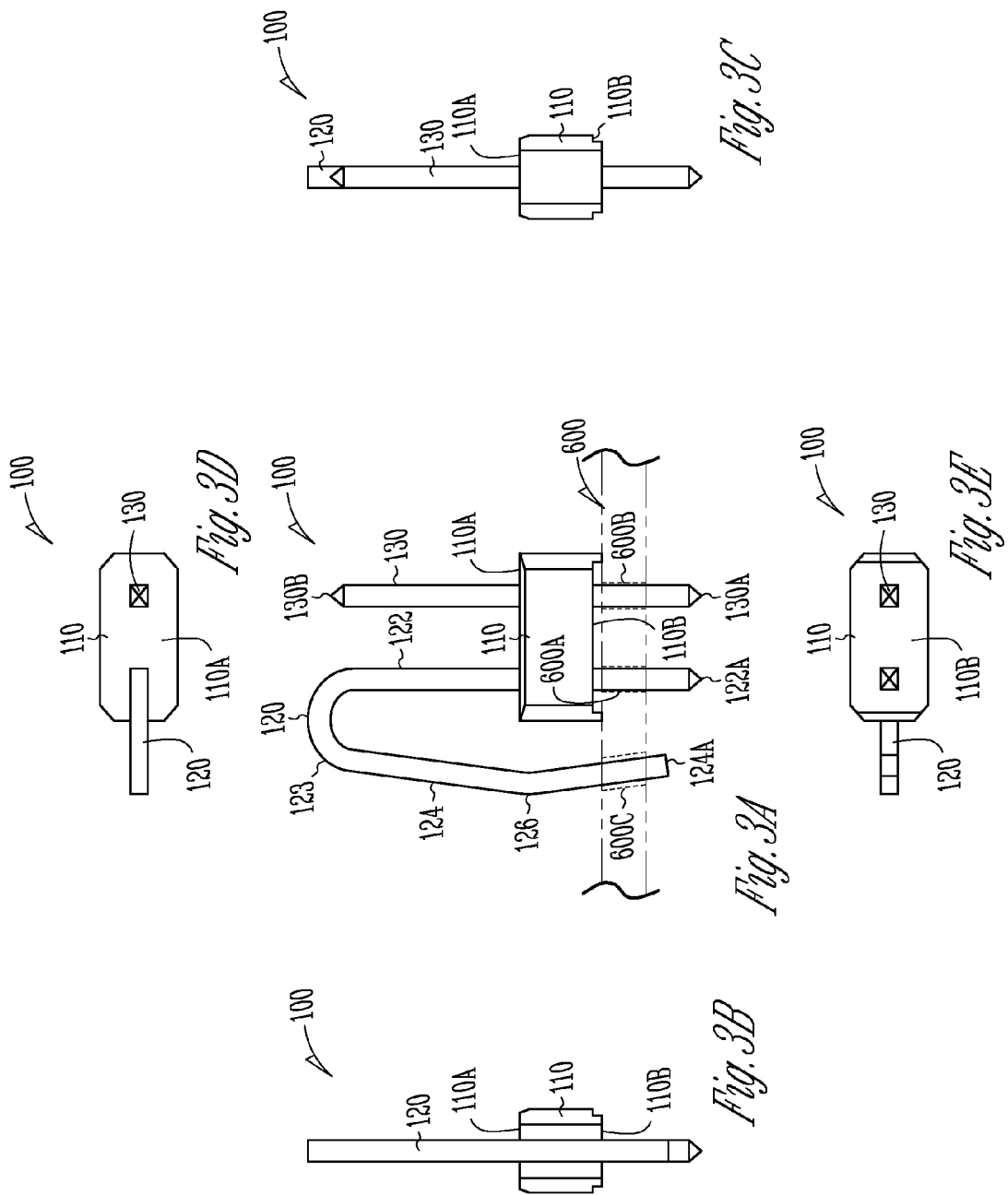

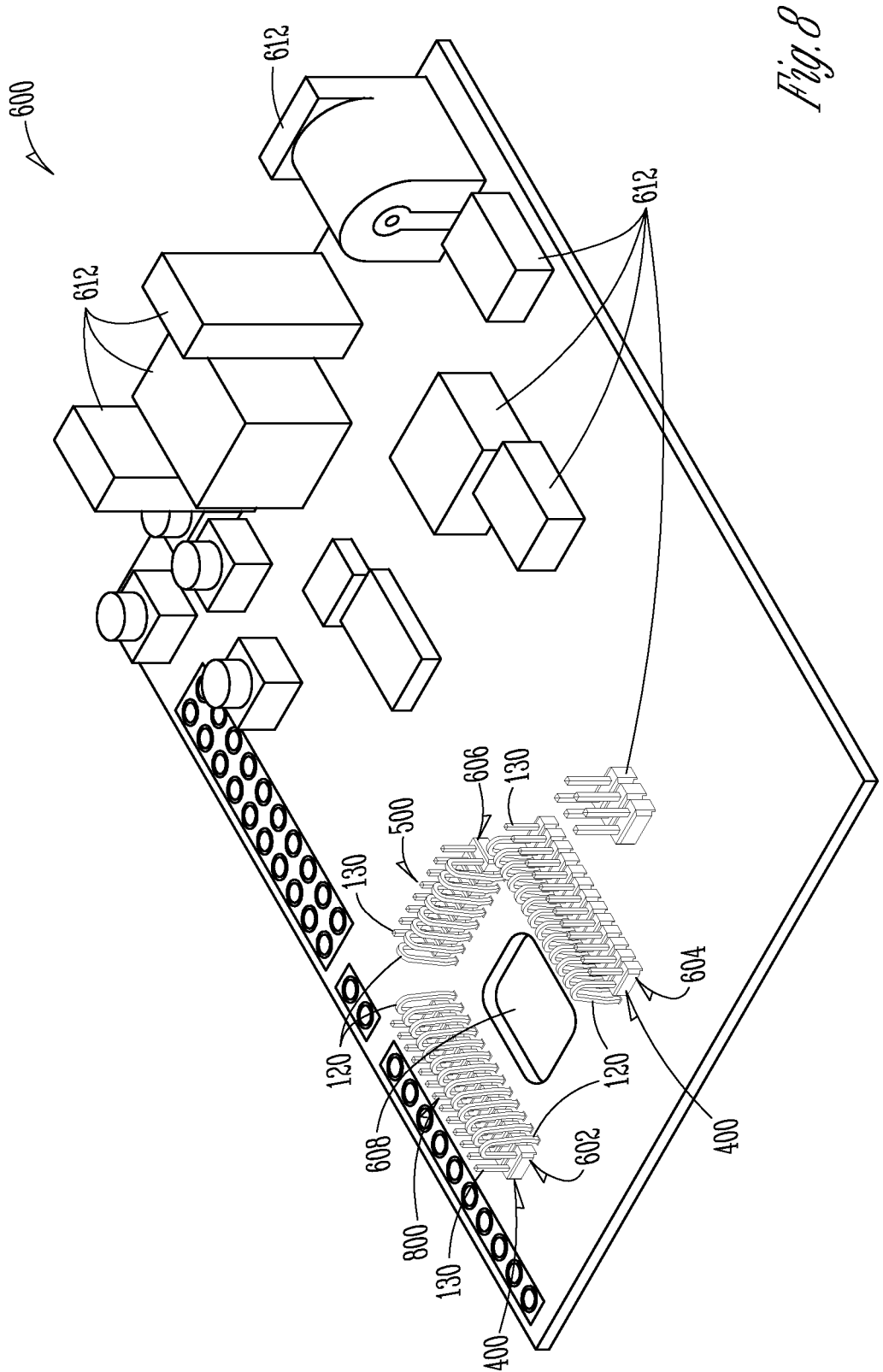

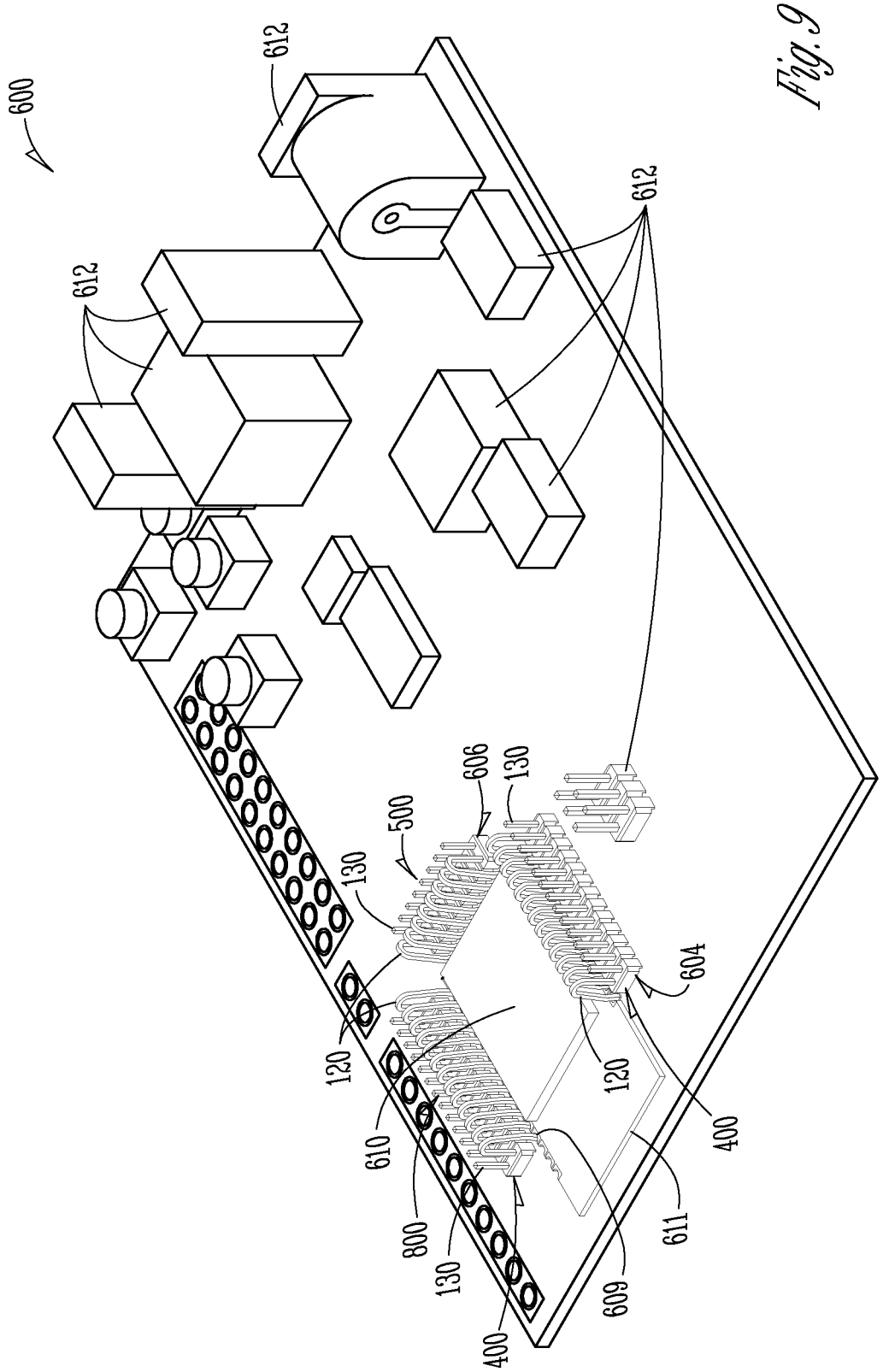

SOCKET FOR SURFACE MOUNT MODULE

RELATED APPLICATIONS

This application is a divisional of and claims the benefit of priority under 35 U.S.C. §120 to U.S. patent application Ser. No. 13/074,300, filed on Mar. 29, 2011, which is incorporated herein by reference in its entirety.

TECHNICAL FIELD

This document pertains generally, but not by way of limitation, to sockets, and more particularly, to solderless sockets.

BACKGROUND

Custom sockets for coupling modules to printed circuit boards (PCBs) are available. Such sockets typically include spring loaded pins or pads with hold down mechanisms (such as, for instance, bars or other latching devices) engageable against the modules to maintain engagement of the modules with the PCBs. While these types of sockets are used in test environments, such sockets are not often used in commercial products due, at least in part, to such sockets being generally prohibitively expensive for use in the commercial market.

OVERVIEW

This document relates generally to apparatuses and methods related to mounting a surface mount module to a PCB. In particular, solderless socket apparatuses and methods are used to mount a surface mount module to a PCB.

Example 1 includes subject matter (such as a header pin assembly) comprising an insulator and a first pin disposed at least partially within the insulator. The first pin includes a first portion configured to electrically couple to a circuit board. A second portion is configured to releasably engage a pin of a surface mount module. The second portion includes a retention feature configured to selectively retain the second portion in engagement with the pin of the surface mount module. The second portion is movable between a first position and a second position, wherein the second portion is biased toward the first position. The second portion is movable to the second position to allow the pin of the surface mount module to pass by the retention feature. The second portion is configured to move back toward the first position to engage the pin of the surface mount module.

In Example 2, the subject matter of Example 1 can optionally include the first portion integrally formed with the second portion.

In Example 3, the subject matter of one or any combination of Examples 1-2 can optionally include the first pin being substantially U-shaped.

In Example 4, the subject matter of one or any combination of Examples 1-3 can optionally include the retention feature including a bend in the second portion.

In Example 5, the subject matter of one or any combination of Examples 1-4 can optionally include a second pin disposed at least partially within the insulator.

In Example 6, the subject matter of one or any combination of Examples 1-5 can optionally include a portion of the first pin being disposed within a hole in the circuit board. The second portion of the first pin is configured to press against the pin of the surface mount module to engage the pin.

In Example 7, the subject matter of Example 6 can optionally include the retention feature being configured to be disposed proximate the hole of the circuit board.

In Example 8, the subject matter of one or any combination of Examples 1-7 can optionally include the second portion of the first pin being free standing.

Example 9 includes subject matter (such as a socket assembly) comprising two or more header pin assemblies. Each header pin assembly includes an insulator and a first pin disposed at least partially within the insulator. Each of the first pins includes a first portion configured to electrically couple to a circuit board. A second portion is configured to releasably engage a corresponding pin of a surface mount module. The second portion includes a retention feature configured to selectively retain the second portion in engagement with the pin of the surface mount module. The second portion is movable between a first position and a second position, wherein the second portion is biased toward the first position. The second portion is movable to the second position to allow the pin of the surface mount module to pass by the retention feature. The second portion is configured to move back toward the first position to engage the pin of the surface mount module.

In Example 10, the subject matter of Example 9 can optionally include the two or more header pin assemblies being configured to engage corresponding pins along at least two sides of the surface mount module.

In Example 11, the subject matter of one or any combination of Examples 9-10 can optionally include the first portion of the first pin being integrally formed with the second portion of the first pin.

In Example 12, the subject matter of one or any combination of Examples 9-11 can optionally include the retention feature including a bend in the second portion of the first pin.

In Example 13, the subject matter of one or any combination of Examples 9-12 can optionally include each header pin assembly including a second pin disposed at least partially within the insulator.

In Example 14, the subject matter of one or any combination of Examples 9-13 can optionally include a portion of each of the first pins being disposed within a corresponding hole in the circuit board. The second portion of each of the first pins is configured to press against the corresponding pin of the surface mount module to engage the pin.

In Example 15, the subject matter of Examples 14 can optionally include each of the retention features being disposed proximate the corresponding hole of the circuit board.

In Example 16, the subject matter of one or any combination of Examples 9-15 can optionally include the second portion of the first pin being free standing.

Example 17 includes subject matter (such as a method) comprising aligning a pin of a surface mount module with a corresponding first pin of a header pin assembly of a socket assembly. The socket assembly is engaged with a circuit board. The first pin includes a first portion configured to electrically couple to a circuit board. A second portion includes a retention feature configured to selectively retain the second portion in engagement with the pin of the surface mount module. The second portion is movable between a first position and a second position, wherein the second portion is biased toward the first position. The surface mount module is moved in a first direction toward the circuit board, wherein the pin of the surface mount module pushes against the second portion to move the second portion to the second position to allow the pin of the surface mount module to pass by the retention feature. The second portion is configured to move back toward the first position once the pin is moved past the retention feature to engage the pin of the surface mount module.

In Example 18, the subject matter of Examples 17 can optionally include moving the surface mount module in a second direction away from the circuit board to remove the surface mount module from the socket assembly, wherein the pin of the surface mount module pushes against the second portion to move the second portion to the second position to allow the pin of the surface mount module to pass by the retention feature and allow removal of the surface mount module from the socket assembly.

Example 19 includes subject matter (such as a method) comprising aligning a plurality of pins of a surface mount module with a corresponding plurality of first pins of a header pin assembly of a socket assembly. The socket assembly is engaged with a circuit board. Each of the first pins includes a first portion configured to electrically couple to a circuit board. A second portion includes a retention feature configured to selectively retain the second portion in engagement with the pin of the surface mount module. The second portion is movable between a first position and a second position, wherein the second portion is biased toward the first position. The surface mount module is moved in a first direction toward the circuit board, wherein the pins of the surface mount module push against the second portions of the first pins to move each of the second portions to the second position to allow the pins of the surface mount module to pass by the retention features of the first pins. Each of the second portions is configured to move back toward the first position once the pin is moved past the retention feature to engage the pin of the surface mount module and engage the surface mount module with the socket assembly.

In Example 20, the subject matter of Example 19 can optionally include removing the surface mount module from engagement with the socket assembly including applying pressure to a bottom of the surface mount module.

In Example 21, the subject matter of one or any combination of Examples 19-20 can optionally include removing the surface mount module including applying pressure to the bottom of the surface mount module through a hole in the circuit board.

These examples can be combined in any permutation or combination. This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 3A-3E illustrate generally side, front, back, top, and bottom views, respectively, of an example of a pin header of an example socket assembly.

FIG. 8 illustrates a perspective view of an example of a socket assembly attached to an example PCB.

FIG. 9 illustrates a perspective view of an example of a socket assembly attached to an example PCB, the socket assembly having an example module engaged therewith.

DETAILED DESCRIPTION

Figure 1:
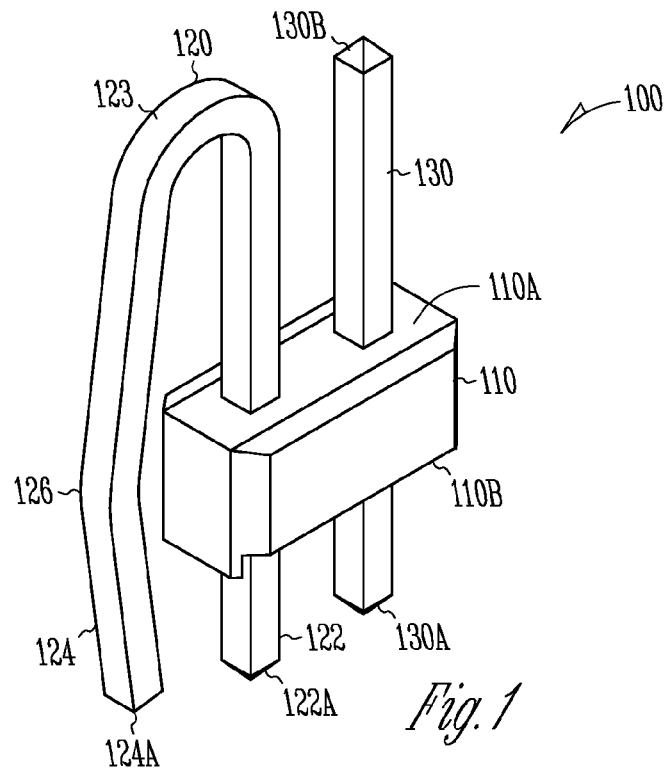
FIG. 1 illustrates generally a perspective view of an example of a pin header of an example socket assembly.

Referring to FIGS. 1-3E, an example of an apparatus that can include a header pin assembly 100 is shown. As will be described in more detail below, various examples of the header pin assembly 100 are included within a socket configured to retain a surface mount module and/or provide positive electrical contact. In some examples, the socket including the header pin assembly 100 is configured to secure a surface mount module to a printed circuit board (PCB) while allowing the relatively easy removal of the surface mount module with little to no damage to either the surface mount module or the PCB. In an example, the header pin assembly 100 of the socket is configured to retain a surface mount module and/or provide positive electrical contact between the header pin assembly 100 of the socket and the surface mount module without the use of solder. It is further contemplated that the various examples of the socket including the header pin assembly 100 can be made for a relatively low cost.

In some examples, the header pin assembly 100 includes an insulator 110. In various examples, the insulator 110 is formed from a nonconductive material. In some examples, the insulator 110 is formed from a polymeric material. In further examples, the insulator 110 is formed from a plastic material. In a still further example, the insulator 110 is formed from a polybutylene terephthalate (PBT) material. In a still further example, the insulator 110 includes a glass fiber reinforced thermoplastic material.

In some examples, the header pin assembly 100 includes a first pin 120 disposed at least partially within the insulator 110. In an example, the first pin 120 is formed into a custom shape. In some examples, the first pin 120 includes a substantially U-shape. In an example, the first pin 120 includes a first portion 122 configured to electrically couple to a circuit board. In an example, the first pin 120 includes a second portion 124 configured to releasably engage a pin 609 (FIG. 9) of a surface mount module 610 (FIG. 9). In some examples, the first and second portions 122, 124 of the first pin 120 are integrally formed. The first and second portions 122, 124 of the first pin 120, in an example, form legs of the U-shaped first pin 120.

With reference to FIGS. 1-3E and 7A-7C, in an example, the first portion 122 extends through the insulator 110 to extend from top and bottom surfaces 110A, 110B of the insulator 110. In an example, the first portion 122 extending from the bottom surface 110B of the insulator 110 includes a free end 122A configured to be electrically coupled to a surface, such as, for instance, a PCB, as will be described in more detail below. In an example, the free end 122A of the first portion 122 of the first pin 120 is configured to be soldered to the PCB.

The first portion 122, in an example, extends from the top surface 110A of the insulator 110 and is attached to the second portion 124 of the first pin 120. In an example, the second portion 124 includes a free end 124A. In an example, the second portion 124 of the first pin 120 is free standing. In a further example, the second portion 124 of the first pin 120 is cantilevered from the first portion 122 of the first pin 120. In some examples, the second portion 124 of the first pin 120 is substantially parallel with the first portion 122 of the first pin 120. In an example, the first pin 120 includes a curved portion 123 disposed between the first and second portions 122, 124. The curved portion 123, in an example, includes substantially a 180-degree bend. In some examples, the second portion 124 of the first pin 120 includes a retention feature 126 configured to selectively retain the second portion 124 in engagement with the pin 609 of the surface mount module 610 (FIG. 9), as will be described in more detail below. In an example, the retention feature 126 includes a bend in the second portion 124. In a further example, the retention feature 126 includes an obtuse bend.

Figure 2:
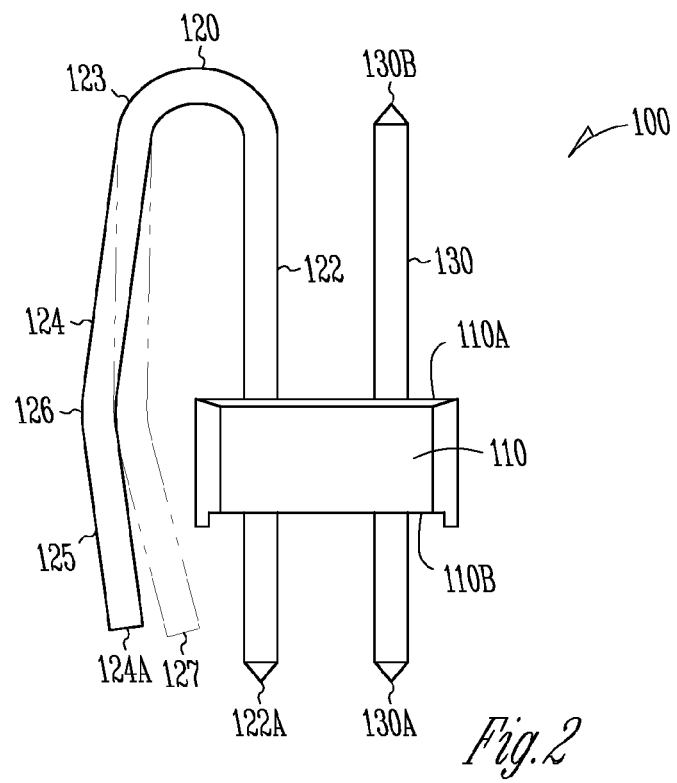
FIG. 2 illustrates generally a side view of an example of a pin header of an example socket assembly.
Figure 4A:
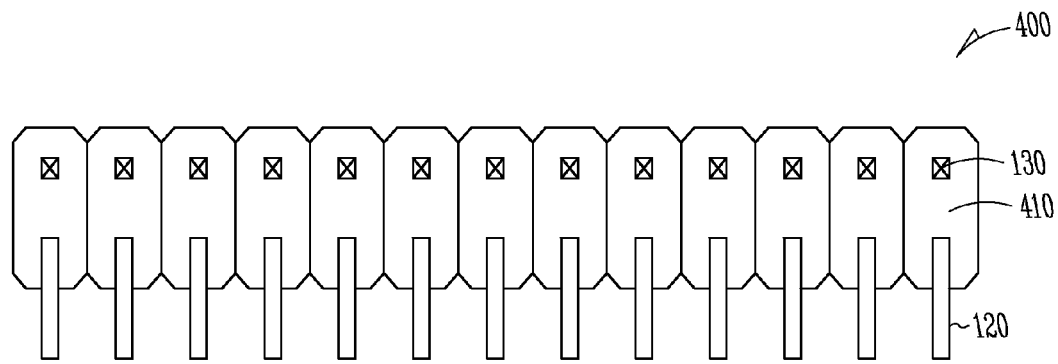
FIGS. 4A-4C illustrate generally top, front, and bottom views, respectively, of an example of a pin assembly of an example socket assembly.
Figure 4B:
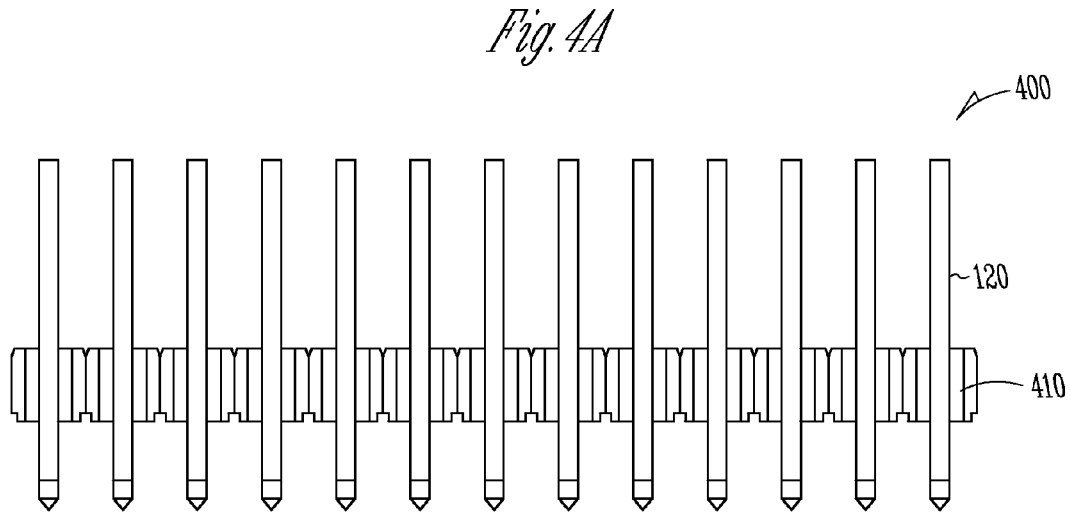
Figure 4C:
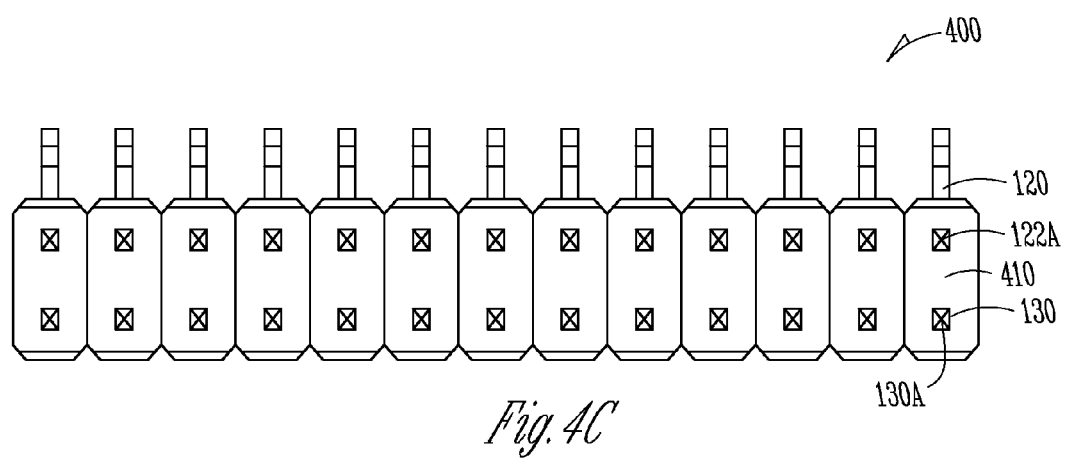
Figure 5A:
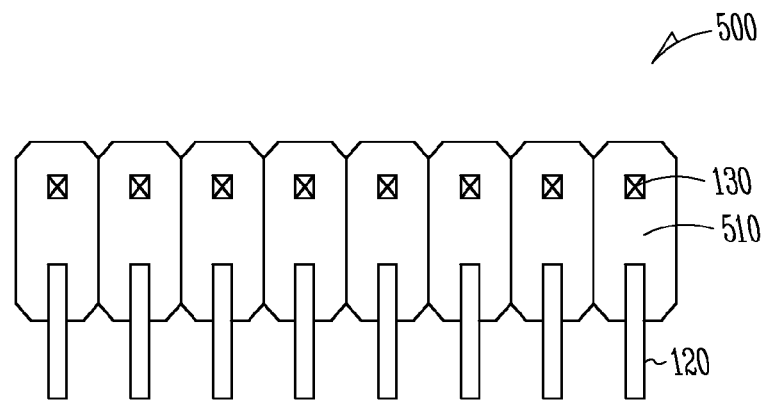
FIGS. 5A-5C illustrate generally top, front, and bottom views, respectively, of an example of a pin assembly of an example socket assembly.
Figure 5B:
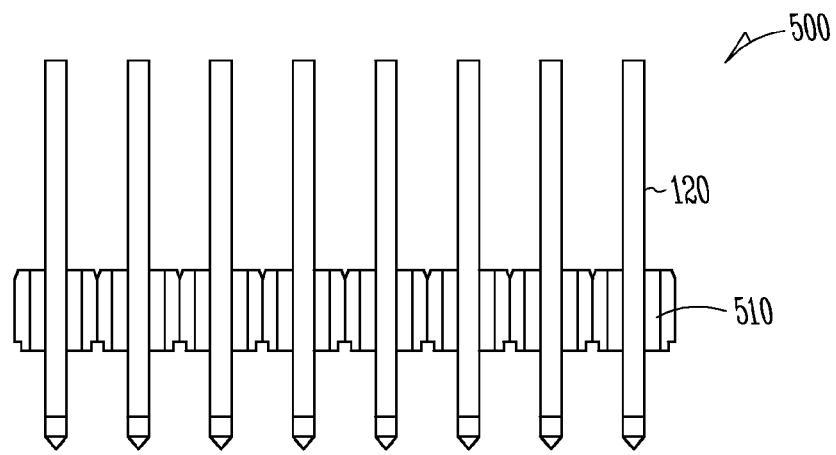
Figure 5C:
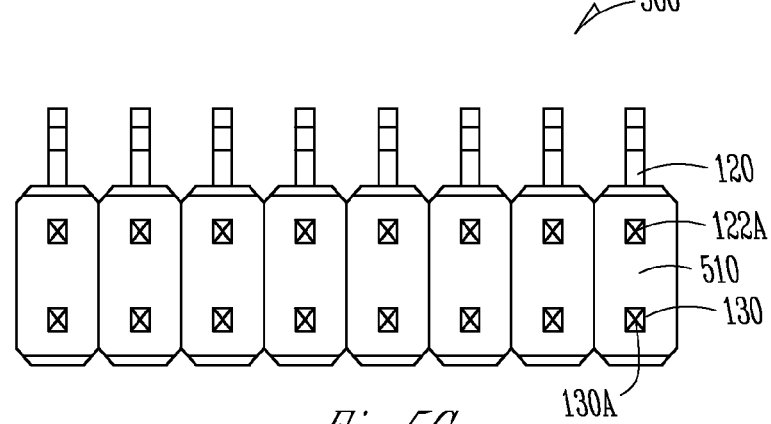

Referring specifically to FIG. 2, in some examples, the second portion 124 is movable between a first position 125 and a second position 127 (shown in phantom). In an example, the second portion 124 is biased toward the first position 125. In an example, the second portion 124 is movable to the second position 125 to allow the pin 609 of the surface mount module 610 (FIG. 9) to pass by the retention feature 126. The second portion 124, in a further example, is configured to move back toward the first position 125 (for instance, once the pin 609 is moved past the retention feature 126) to engage the pin 609 of the surface mount module 610. In an example, the second portion 124 is configured to flex between the first and second positions 125, 127. That is, resilience of the first pin 120 allows the first pin 120 to flex between the first and second positions 125, 127. The second portion 124, in some examples, is configured to push against the pin 609 of the surface mount module 610 to engage and/or electrically couple to pin 609. For instance, the first pin 120 of the header pin assembly 100 is positioned such that, with the surface mount module 610 seated with respect to the header pin assembly 100, the pin 609 is located at or just before the first position 125 of the second portion 124. In this way, the second portion 124 at least contacts the pin 609, if not pushes against the pin 609 at least slightly. In an example, the retention feature 126 of the first pin 120 provides a downward (toward the PCB) force on the pin 609 to engage the first pin 120 and the pin 609. The presence of the retention feature 126 of the first pin 120 also provides, in some examples, a detent-like arrangement to provide a positive, "snap-in" engagement with movement of the pin 609 past the retention feature 126 of the first pin 120. By configuring the interaction of the first pin 120 with the pin 609 in this way, relatively secure engagement and electrical contact between the first pin 120 and the pin 609 of the surface mount module 610 is maintained without the use of solder and/or separate hold down mechanisms or spring-loaded pads.

Referring again to FIGS. 1-3E, in some examples, the header pin assembly 100 includes a second pin 130 disposed at least partially within the insulator. In an example, the second pin 130 extends through the insulator 110 to extend from the top and bottom surfaces 110A, 110B of the insulator 110. In an example, the second pin 130 includes a free end 130A extending from the bottom surface 110B of the insulator 110, the free end 130A configured to be coupled to a surface, such as, for instance, the PCB. In an example, the second pin 130 includes a free end 130B extending from the top surface 110A of the insulator 110. In an example, the free end 130A of the second pin 130 is configured to be soldered to the PCB. In an example, the engagement of the second pin 130 with the PCB or other surface provides stability and resists rotation or other movement of the header pin assembly 100, for instance, during engagement or disengagement of the pin 609 with the header pin assembly 100.

In various examples, one or both of the first and second pins 120, 130 are formed from a conductive material. In an example, one or both of the first and second pins 120, 130 are formed from a metallic material. In a further example, one or both of the first and second pins 120, 130 are formed from a phosphor bronze material.

Referring to FIG. 3A, in some examples, a surface, such as a PCB 600 (shown in phantom), is configured for mounting of the header pin assembly 100 thereto. In an example, the PCB 600 includes one or more through holes 600A-C configured for engagement with the header pin assembly 100. In an example, one or both of the first and second pins 120, 130 are placed within the one or more corresponding holes 600A, 600B of the PCB 600. In a further example, one or both of the free ends 122A, 130A of the first and second pins 120, 130 are placed within the one or more corresponding holes 600A, 600B of the PCB 600. In an example, one or both of the first and second pins 120, 130 are soldered to the one or more corresponding holes 600A, 600B of the PCB 600. In a further example, one or both of the holes 600A, 600B are plated with a conductive material. As described above, in an example, both of the first and second pins 120, 130 are engaged with the PCB 600, for instance to provide stability and resist rotation or other movement of the header pin assembly 100. In this example, the free end 122A of the first pin 120 is disposed within a first hole 600A and the free end 130A of the second pin 130 is disposed within a second hole 600B to mount the header pin assembly 100 to the PCB 600. In some examples, the free end 124A of the second portion 124 of the first pin 120 is disposed in or proximate a third hole 600C of the PCB 600 with the header pin assembly 100 mounted to the PCB 600. In an example, the third hole 600C of the PCB 600 is unplated. In an example, the second portion 124 of the first pin 120 is disposed within the third hole 600C in the PCB 600. In an example, the third hole 600C of the PCB limits movement and/or deformation of the second portion 124 of the first pin 120. In a further example, the second portion 124 of the first pin 120 is configured to press against the pin 609 of the surface mount module 610 (FIG. 9) to engage the pin 609. In some examples, the retention feature 126 is configured to be disposed proximate the third hole 600C of the PCB 600 with the header pin assembly 100 mounted to the PCB 600. In an example, the retention feature 126 is disposed above the third hole 600C. In a further example, the retention feature 126 is disposed sufficiently above the third hole 600C to allow the pin 609 of the surface mount module 610 to pass below the retention feature 126 and be disposed above the surface of the PCB 600 and in engagement with the second portion 124 of the first pin 120. In this way, the pin 609 of the surface mount module 610 can "snap in" as the surface mount module 610 is seated with respect to the PCB 600 or just prior to the surface mount module 610 seating with respect to the PCB 600. In various examples, the second portion 124 is capable of moving between the first and second positions 125, 127 (FIG. 2) while disposed within the third hole 600C of the PCB to allow engagement of the first pin 120 with the pin 609 of the surface mount module 610, as described above.

Referring to FIGS. 4A-5C, examples of multiple header pin assemblies 400, 500 are shown. For instance, the header pin assembly 400 essentially includes thirteen connected single header pin assemblies (similar to the header pin assembly 100 described above), and the header pin assembly 500 essentially includes eight connected single header pin assemblies (similar to the header pin assembly 100 described above). In an example, the header pin assembly 400 includes a single integral insulator 410 configured to accommodate thirteen first pins 120 and thirteen second pins 130, and the header pin assembly 500 includes a single integral insulator 510 configured to accommodate eight first pins 120 and eight second pins 130. In another example, the header pin assembly 400 includes thirteen header pin assemblies 100, and the header pin assembly 500 includes eight header pin assemblies 100. In a further example, the single header pin assemblies 100 are connected to form the multiple header pin assemblies 400, 500. For instance, the header pin assemblies 100 can be connected using adhesive, welding, and/or interlocking features to form the header pin assemblies 400, 500. Although the example multiple header pin assemblies 400, 500 are described and shown with thirteen and eight connected header pin assemblies 100, respectively, in other examples, a multiple header pin assembly can include one or more single header pin assemblies (similar to the header pin assembly 100 described above), depending upon the number of pins of the surface mount module to be used with the multiple header pin assembly.

Referring now to FIGS. 1-9, aspects of a socket assembly 800 are shown. In an example, the socket assembly 800 is included with a circuit board assembly, the socket assembly 800 being coupled to the PCB 600, which includes one or more electronic devices 612 coupled to the PCB 600. In some examples, the socket assembly 800 can be electrically coupled to the one or more electronic devices 612 through one or more electrical connections of the PCB 600. In some examples, the socket assembly 800 includes two or more header pin assemblies 100, 400, 500. In various examples, the size and number of header pin assemblies 100, 400, 500 used with the socket 800 vary with the number and placement of pins of the surface mount module (for instance, surface mount module 610 of FIG. 9) to be mounted to a PCB, such as PCB 600. In an example, header pin assemblies 100, 400, 500 are configured to engage corresponding pins 609 along one or more sides of the surface mount module 610. In an example, the two or more header pin assemblies 100, 400, 500 are configured to engage corresponding pins 609 along at least two sides of the surface mount module 610. In an example, the two sides of the surface mount module 610 are opposing sides. In some examples, each header pin assembly 100, 400, 500 includes an insulator 110, 410, 510 and a first pin 120 disposed at least partially within the insulator 110, 410, 510. In some examples, the first pin 120 is similar to that which is described above. In some examples, each header pin assembly 100, 400, 500 includes a second pin 130 disposed at least partially within the insulator 110, 410, 510. In some examples, the second pin 130 similar to that which is described above.

Figure 6:
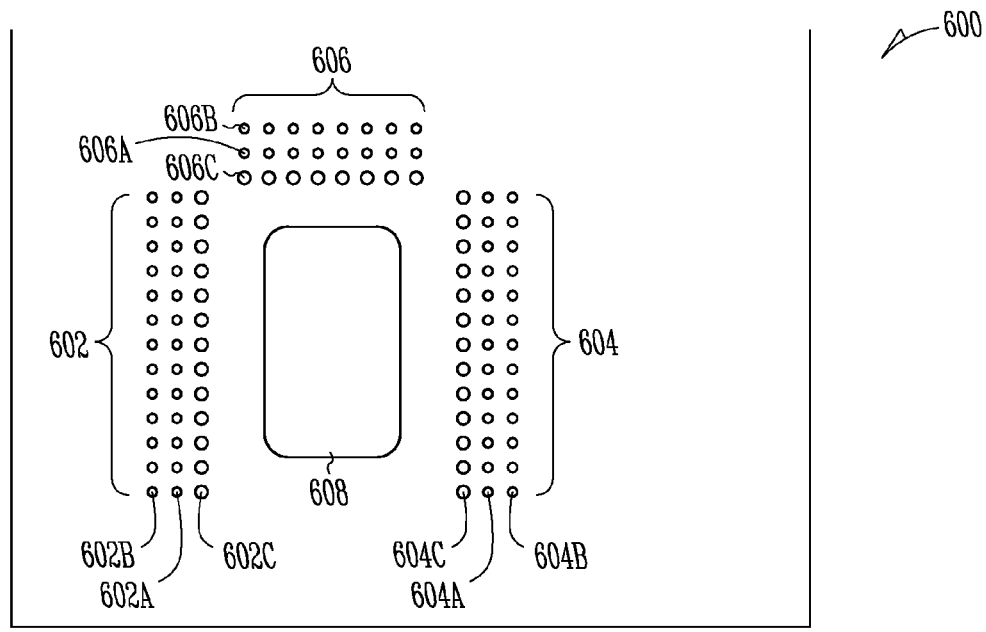
FIG. 6 illustrates generally a top view of an example of a printed circuit board (PCB) configured to accept an example socket assembly.
Figures 7A, 7B:
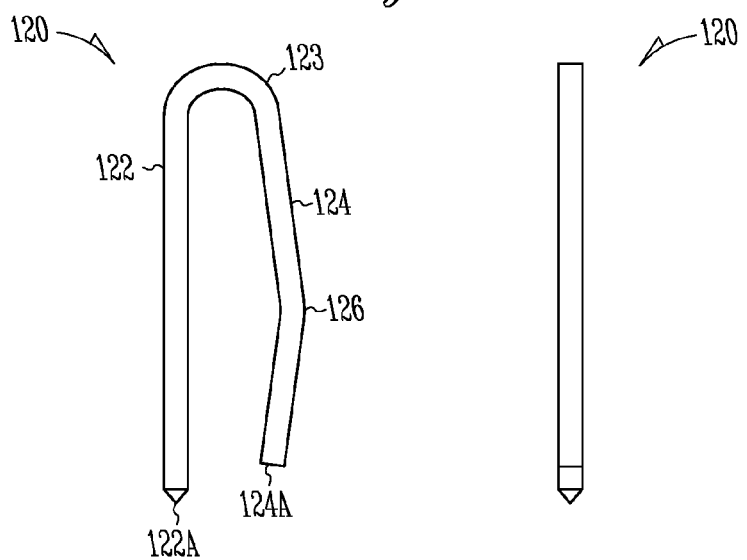
FIGS. 7A-7C illustrate generally side, front, and bottom views of an example of a pin of an example pin header.
Figure 7C:
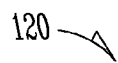

Referring now to FIGS. 6, 8, and 9, in some examples, the PCB 600 includes through holes located and spaced to accommodate attachment to the PCB 600 of one or more header pin assemblies (for instance, similar to the header pin assemblies 100, 400, 500 described above). The number of through holes, in some examples, varies according to the size or sizes of the one or more header pin assemblies needed to accommodate the particular surface mount module that is desired to be removably mounted to the PCB 600. Although in various examples, the sizes, number, and configuration of the one or more header pin assemblies varies according to the surface mount module desired to be mounted to the PCB 600, for the purposes of illustration, the example shown in FIGS. 6, 8, and 9 will be described. In this example, a location for mounting a surface mount module 610 includes through holes disposed along three sides 602, 604, 606. As stated above, the number, spacing, and location of the through holes along each side 602, 604, 606 are varied in different examples, according to the number of pins needed to mount the particular surface mount module. In this example, the surface mount module 610 includes thirteen pins 609 along two opposing sides and eight pins 609 along a third side. Accordingly, the PCB 600 includes thirteen rows of through holes along first and second sides 602, 604 and eight rows of through holes along a third side 606. In an example, the sides 602, 604, 606 are positioned along three sides of a rectangle in order to accommodate the pins 609 of the surface mount module 610. However, in other examples, if the shape or configuration of the surface mount module were different, the sides, or otherwise the spacing, position, and number of the through holes, can be varied.

In some examples, each row of through holes of the first side 602 includes first and second through holes 602A, 602B configured to accept and electrically couple to one or both of the free ends 122A, 130A of the first and second pins 120, 130 of the header pin assembly 400. In an example, one or both of the first and second through holes 602A, 602B are plated to allow an electrical connection between one or both of the first and second through holes 602A, 602B and one or both of the first and second pins 120, 130 of the header pin assembly 400. In some examples, one or both of the first and second pins 120, 130 can be soldered within one or both of the first and second holes 602A, 602B. In a further example, each row of through holes of the first side 602 includes a third through hole 602C configured to accept the free end 124A of the first pin 120 of the header pin assembly 400. In an example, the third through hole 602C of each row is larger than the first or second through hole 602A, 602B in order to accommodate the movement of the second portion 124 (and the free end 124A) of the first pin 120 between the first and second positions 125, 127, as described above with respect to FIG. 2. In an example, the third through hole 602C is unplated.

In some examples, each row of through holes of the second side 604 includes first and second through holes 604A, 604B configured to accept and electrically couple to one or both of the free ends 122A, 130A of the first and second pins 120, 130 of the header pin assembly 400. In an example, one or both of the first and second through holes 604A, 604B are plated to allow an electrical connection between one or both of the first and second through holes 604A, 604B and one or both of the first and second pins 120, 130 of the header pin assembly 400. In some examples, one or both of the first and second pins 120, 130 can be soldered within one or both of the first and second holes 604A, 604B. In a further example, each row of through holes of the second side 604 includes a third through hole 604C configured to accept the free end 124A of the first pin 120 of the header pin assembly 400. In an example, the third through hole 604C of each row is larger than the first or second through hole 604A, 604B in order to accommodate the movement of the second portion 124 (and the free end 124A) of the first pin 120 between the first and second positions 125, 127, as described above with respect to FIG. 2. In an example, the third through hole 604C is unplated.

In some examples, each row of through holes of the third side 606 includes first and second through holes 606A, 606B configured to accept and electrically couple to one or both of the free ends 122A, 130A of the first and second pins 120, 130 of the header pin assembly 500. In an example, one or both of the first and second through holes 606A, 606B are plated to allow an electrical connection between one or both of the first and second through holes 606A, 606B and one or both of the first and second pins 120, 130 of the header pin assembly 400.

In some examples, one or both of the first and second pins 120, 130 can be soldered within one or both of the first and second holes 606A, 606B. In a further example, each row of through holes of the third side 606 includes a third through hole 606C configured to accept the free end 124A of the first pin 120 of the header pin assembly 500. In an example, the third through hole 606C of each row is larger than the first or second through hole 606A, 606B in order to accommodate the movement of the second portion 124 (and the free end 124A) of the first pin 120 between the first and second positions 125, 127, as described above with respect to FIG. 2. In an example, the third through hole 606 is unplated.

Referring to FIGS. 8 and 9, in an example, the PCB 600 is shown with the header pin assemblies 400 attached to the first and second sides 602, 604 and the header pin assembly 500 attached to the third side 606 to form the socket assembly 800. In an example, the socket assembly 800 is configured to removably mount the surface mount module 610 to the socket assembly 800 and electrically couple the surface mount module 610 to the PCB 600. In some examples, the configuration of the first pins 120 of the header pin assemblies 400, 500 of the socket assembly 800 is similar to that described above, such that the first pins 120 provide a snap-in engagement configuration for mounting of the surface mount module 610 within the socket 800. That is, the first pins 120, in an example, are configured to move between the first position 125 and the second position 127 to allow the pins 609 of the surface mount module 610 to pass below the retention features 126 of the first pins 120 with downward pressure (toward the PCB 600) applied to the surface mount module 610, in a manner similar to that described above with respect to FIG. 2. With the pins 609 passing the retention features 126 of the first pins 120, the first pins 120 move back toward the first position 125 once the pins 609 are moved past the retention features 126 to engage the pins 609 of the surface mount module 610. In some examples, the surface mount module 610 includes one or more substantially U-shaped or slotted pins 609 each configured to accept the second portion 124 of the first pin 120 within the slot or U shape to enhance engagement between each of the pins 609 and each of the first pins 120. In a further example, the surface mount module 610 includes a castellated portion 611 in which the pins 609 are formed. In a still further example, the castellated portion 611 includes a castellated via or pad. In this way, the configuration of the first pins 120 allows the surface mount module 610 to be snapped into place and/or otherwise retained in the socket assembly 800 to electrically couple the pins 609 of the surface mount module 610 to the corresponding first pins 120 of the header pin assemblies 400, 500 and, thereby, to the PCB 600.

In some examples, to remove the surface mount module 610 from engagement with the socket assembly 800, upward pressure (away from the PCB 600) is applied to the surface mount module 610. In an example, the upward force is sufficient to push the pins 609 of the surface mount module 610 upward with respect to the first pins 120 of the socket assembly 800 (moving the first pins 120 from the first position 125 to the second position 127) in order to pass by the retention features 126 of the first pins 120, thereby disengaging the surface mount module 610 from the socket assembly 800. In various examples, the upward pressure is applied to the surface mount module 610 by pushing or pulling on the surface mount module 610. In some examples, the configuration of the socket assembly 800, the PCB 600, and/or the surface mount module 610 allows for the application of upward pressure to a bottom side of the surface mount module 610. In an example, the PCB 600 includes a void or a hole 608 proximate the socket assembly 800 and positioned to allow access to the bottom surface of the surface mount module 610, when mounted within the socket assembly 800, to allow one to apply upward pressure to the surface mount module 610. In an example, a tool or other instrument can be used to grab, pry, or otherwise remove the surface mount module 610 from engagement with the socket assembly 800.

As stated above, the configuration of the socket assembly 800 described above is merely exemplary and other configurations (including different numbers, locations, configurations, etc. of header pin assemblies, first pins, etc.) are contemplated herein and can be varied according to the configuration of the surface mount module intended to be mounted to the PCB using the socket assembly.

In some examples, with reference to FIGS. 1-9, a method of mounting the surface mount module 610 includes aligning one or more pins 609 of the surface mount module 610 with one or more corresponding first pins 120 of one or more header pin assemblies 100, 400, 500 of the socket assembly 800. In some examples, the socket assembly 800 is engaged with the PCB 600. Each of the one or more first pins 120, in various examples, include a first portion 122 configured to electrically couple to the circuit board PCB 600. In some examples, each of the one or more first pins 120 includes the second portion 124, which includes the retention feature 126 configured to selectively retain the second portion 124 in engagement with the corresponding pin 609 of the surface mount module 610. In some examples, each of the one or more second portions 124 is movable between the first position 125 and the second position 127. In a further example, the one or more second portions 124 are biased toward the first position 125. The method further includes, in some examples, moving the surface mount module 610 in a first direction toward the PCB 600. In some examples, the one or more pins 609 of the surface mount module 610 push against the corresponding one or more second portions 124 to move the one or more second portions 124 to the second position 127 to allow the one or more pins 609 of the surface mount module 610 to pass by the one or more retention features 126. In various examples, the one or more second portions 124 are configured to move back toward the first position 125 once the corresponding one or more pins 609 are moved past the one or more retention features 126 to engage the one or more pins 609 of the surface mount module 610.

In some examples, the method includes moving the surface mount module 610 in a second direction away from the PCB 600 to remove the surface mount module 610 from the socket assembly 800. The one or more pins 609 of the surface mount module 610 push against the corresponding one or more second portions 124 to move the one or more second portions 124 to the second position 127 to allow the one or more pins 609 of the surface mount module 610 to pass by the one or more retention features 126 and allow removal of the surface mount module 610 from the socket assembly 800. In further examples, removing the surface mount module 610 from engagement with the socket assembly 800 includes applying pressure to a bottom of the surface mount module 610. In still further examples, removing the surface mount module 610 includes applying pressure to the bottom of the surface mount module 610 through the void or the hole 608 in the PCB 600.

The various examples of the header pin assemblies 100, 400, 500, socket assemblies 800, and methods thereof described above provide removable mounting of a surface mount module 610 to a PCB 600. Such assemblies and/or methods are believed to be advantageous for many reasons. For instance, the present configuration of the first pin 120 allows for a pressure "snap-in" retention feature. In some examples, such an arrangement provides electrical connection of the surface mount module 610 without the use of solder between the pin 609 of the surface mount module 610 and the first pin 120 of the header pin assembly 100, 400, 500 of the socket assembly 800. In further examples, such a configuration enables mounting and/or removal of the surface mount module 610 from the header pin assemblies 100, 400, 500 and/or the socket assembly 800 with a decreased likelihood of damage to either the surface mount module 610, the header pin assemblies 100, 400, 500, the socket assembly 800, or the PCB 600. In various examples, the through hole header pin assembly configuration and the shape and configuration of the first pin 120 (namely the second portion 124 including the retention feature 126 and movable between the first and second positions 125, 127) allow for retention of the surface mount module 610 on the PCB 600 and provide positive electrical contact between the first pin 120 and the corresponding pin 609 of the surface mount module 610. Such an arrangement is relatively easily configurable, in that the header pin assemblies 100, 400, 500 can be adjusted to correspond to the number, location, and spacing of the pins 609 of the surface mount module 610. As stated above, individual header pin assemblies (such as header pin assembly 100) can be used alone or in conjunction to form multiple header pin assemblies, or multiple header pin assemblies (such as header pin assembly 400, 500) can be produced with an integral insulator (such as insulator 410, 510), according to the configuration of the pins 609 of the surface mount module 610 to be mounted to the PCB 600. Because the one or more first pins 120 of the header pin assembly or socket assembly are configured, as stated above, to retain the one or more corresponding pins 609 of the surface mount module 610, no additional assemblies (such as latches, clips, spring-loaded pins or pads, etc.) are required to retain the surface mount module 610 in engagement with the one or more first pine 120. As such, a cost of production is reduced from systems requiring such additional assemblies. In this way, the header pin assemblies 100, 400, 500, socket assemblies 800, and methods thereof described above provide a cost effective manner of providing removable mounting of a surface mount module 610 to a PCB 600.

ADDITIONAL NOTES

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A method comprising:
   aligning a pin of a surface mount module with a corresponding first pin of a header pin assembly of a socket assembly, the socket assembly being engaged with a circuit board, the first pin including:
      a first portion configured to electrically couple to the circuit board; and
      a second portion including a retention feature configured to selectively retain the second portion in engagement with the pin of the surface mount module, the second portion being movable between a first position and a second position, wherein the second portion is biased toward the first position;
   moving the surface mount module in a first direction toward the circuit board, wherein the pin of the surface mount module pushes against the second portion to move the second portion to the second position to allow the pin of the surface mount module to pass by the retention feature, the second portion configured to move back toward the first position once the pin is moved past the retention feature to engage the pin of the surface mount module; and
   moving the surface mount module in a second direction away from the circuit board to remove the surface mount module from the socket assembly, wherein the pin of the surface mount module pushes against the second portion to move the second portion to the second position to allow the pin of the surface mount module to pass by the retention feature and allow removal of the surface mount module from the socket assembly, wherein moving the surface mount module in a second direction away from the circuit board to remove the surface mount module from the socket assembly includes applying pressure to a bottom surface of the surface mount module.

2. The method of claim 1, wherein applying pressure to the bottom surface of the surface mount module includes applying pressure to the bottom surface through a void in the circuit board.

3. The method of claim 1, wherein applying pressure to the bottom surface of the surface mount module includes applying pressure to the bottom surface using a tool.

4. The method of claim 1, wherein moving the surface mount module in the first direction includes moving the pin past the retention feature, the retention feature providing a downward force on the pin of the surface mount module with the pin moved past the retention feature.

5. The method of claim 4, wherein moving the pin past the retention feature includes moving the pin past a bend of the retention feature, the bend being disposed in the second portion of the first pin.

6. The method of claim 4, wherein moving the pin past the retention feature includes locating the pin between the retention feature and a top surface of the circuit board.

7. The method of claim 1, wherein aligning the pin of the surface mount module includes aligning the pin formed in a castellated portion of the surface mount module.

8. A method comprising:
  aligning a plurality of pins of a surface mount module with a corresponding plurality of first pins of a header pin assembly of a socket assembly, the socket assembly being engaged with a circuit board, each of the first pins including:
    a first portion configured to electrically couple to the circuit board; and
    a second portion including a retention feature configured to selectively retain the second portion in engagement with the pin of the surface mount module, the second portion being movable between a first position and a second position, wherein the second portion is biased toward the first position;
  moving the surface mount module in a first direction toward the circuit board, wherein the pins of the surface mount module push against the second portions of the first pins to move each of the second portions to the second position to allow the pins of the surface mount module to pass by the retention features of the first pins, each of the second portions being configured to move back toward the first position once the pin is moved past the retention feature to engage the pin of the surface mount module and engage the surface mount module with the socket assembly; and
  removing the surface mount module from engagement with the socket assembly, wherein removing the surface mount module includes applying pressure to a bottom of the surface mount module.

9. The method of claim 8, wherein removing the surface mount module includes applying pressure to the bottom of the surface mount module through a hole in the circuit board.

10. The method of claim 8, wherein removing the surface mount module includes applying pressure to the bottom of the surface mount module using a tool.

11. The method of claim 8, wherein moving the surface mount module in the first direction includes moving the pins past the retention features, each of the retention features providing a downward force on each of the pins of the surface mount module with the pins moved past the retention feature.

12. The method of claim 11, wherein moving the pins past the retention features includes moving each of the pins past a bend of each of the retention features, the bend being disposed in the second portion of each of the first pins.

13. The method of claim 11, wherein moving the pins past the retention features includes locating each of the pins between the retention feature and a top surface of the circuit board.

14. The method of claim 8, wherein aligning the plurality of pins of the surface mount module includes aligning the pins formed in a castellated portion of the surface mount module.

15. A method comprising:
  aligning a pin of a surface mount module with a corresponding first pin of a header pin assembly of a socket assembly, the socket assembly being engaged with a circuit board, the first pin including:
    a first portion configured to electrically couple to the circuit board; and
    a second portion including a retention feature configured to selectively retain the second portion in engagement with the pin of the surface mount module, the second portion being movable between a first position and a second position, wherein the second portion is biased toward the first position;
  moving the surface mount module in a first direction toward the circuit board, wherein the pin of the surface mount module pushes against the second portion to move the second portion to the second position to allow the pin of the surface mount module to pass by the retention feature, the second portion configured to move back toward the first position once the pin is moved past the retention feature to engage the pin of the surface mount module, the retention feature providing a downward force on the pin of the surface mount module with the pin moved past the retention feature; and
  removing the surface mount module from engagement with the socket assembly, wherein removing the surface mount module includes applying pressure to a bottom of the surface mount module through a hole in the circuit board.

16. The method of claim 15, wherein removing the surface mount module includes applying pressure to the bottom of the surface mount module using a tool.

17. The method of claim 15, wherein moving the surface mount module in the first direction includes moving the pin past a bend in the retention feature, the bend being disposed in the second portion of the first pin.

* * * * *